(12) United States Patent
Derner (10) Patent No.: US 11,705,186 B2
(45) Date of Patent: *Jul. 18, 2023

(54) STORAGE AND OFFSET MEMORY CELLS

(71) Applicant: Micron Technology, Inc., Boise, ID (US)

(72) Inventor: Scott J. Derner, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/497,382

(22) Filed: Oct. 8, 2021

(65) Prior Publication Data

US 2022/0028447 A1 Jan. 27, 2022

Related U.S. Application Data

(63) Continuation of application No. 16/543,315, filed on Aug. 16, 2019, now Pat. No. 11,145,358.

(60) Provisional application No. 62/725,889, filed on Aug. 31, 2018.

(51) Int. Cl.
| | |
|---|---|
| G11C 7/12 | (2006.01) |
| G11C 11/4091 | (2006.01) |
| G11C 11/408 | (2006.01) |
| G11C 11/4094 | (2006.01) |
| G11C 7/06 | (2006.01) |
| G11C 8/08 | (2006.01) |
| G11C 11/4099 | (2006.01) |
| G11C 7/14 | (2006.01) |

(52) U.S. Cl.
CPC .......... *G11C 11/4091* (2013.01); *G11C 7/065* (2013.01); *G11C 7/12* (2013.01); *G11C 8/08* (2013.01); *G11C 11/4085* (2013.01); *G11C 11/4094* (2013.01); *G11C 7/14* (2013.01); *G11C 11/4099* (2013.01)

(58) Field of Classification Search
CPC .................. G11C 11/4091; G11C 11/4085
See application file for complete search history.

(56) References Cited

U.S. PATENT DOCUMENTS

| | | |
|---|---|---|
| 4,771,404 A | 9/1988 | Mano |
| 4,947,376 A | 8/1990 | Arimoto |
| 5,831,895 A | 11/1998 | Manning |
| 6,128,213 A | 10/2000 | Kang |

(Continued)

FOREIGN PATENT DOCUMENTS

WO 2016164270 A1 10/2016

OTHER PUBLICATIONS

International Search Report and Written Opinion from related international application No. PCT/US2019/047826, dated Dec. 10, 2019, 12 pages.

*Primary Examiner* — Mushfique Siddique
(74) *Attorney, Agent, or Firm* — Brooks, Cameron & Huebsch, PLLC (57) ABSTRACT

An example apparatus includes a sense amplifier, a plurality of storage memory cells coupled to the sense amplifier via a first digit line, and a plurality of offset memory cells coupled to the sense amplifier via a second digit line. The plurality of storage memory cells and the plurality of offset memory cells can comprise an array of memory cells. Each of the storage memory cells and the offset memory cells can include a respective capacitor having a particular capacitance.

15 Claims, 7 Drawing Sheets

(56) References Cited

U.S. PATENT DOCUMENTS

| | | |
|---|---|---|
| 6,292,417 B1 | 9/2001 | Seyyedy |
| 7,662,693 B2 | 2/2010 | Bhattacharyya |
| 7,875,529 B2 | 1/2011 | Forbes et al. |
| 8,274,777 B2 | 9/2012 | Kiehlbauch |
| 2009/0116318 A1 | 5/2009 | Kuroda |
| 2009/0191677 A1 | 7/2009 | Forbes |
| 2010/0329056 A1 | 12/2010 | Moon |
| 2016/0300599 A1 | 10/2016 | Pelley et al. |
| 2016/0336933 A1* | 11/2016 | Krishna ............... H03K 5/2481 |
| 2017/0345509 A1 | 11/2017 | Tran et al. |
| 2018/0151200 A1* | 5/2018 | Miyazaki ............... G11C 5/063 |
| 2018/0182449 A1* | 6/2018 | Kim ............... G11C 7/02 |

\* cited by examiner

STORAGE AND OFFSET MEMORY CELLS

PRIORITY INFORMATION

This application is a Continuation of U.S. application Ser. No. 16/543,315, filed Aug. 16, 2019, which claims the benefit of U.S. Provisional Application No. 62/725,889, filed Aug. 31, 2018, the contents of which are included herein by reference.

TECHNICAL FIELD

The present disclosure relates generally to semiconductor memory and methods, and more particularly, to apparatuses and methods for including storage memory cells and offset memory cells.

BACKGROUND

Memory devices are typically provided as internal, semiconductor, integrated circuits in computers or other electronic systems. There are many different types of memory including volatile and non-volatile memory. Volatile memory can require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

DETAILED DESCRIPTION

The present disclosure includes apparatuses and methods for utilization of memory cells of an array of memory cells as storage memory cells and offset memory cells. A sense amplifier can be coupled to two conductive lines. One of the conductive lines can be a digit line to which a memory cell from which a data value is being sensed (e.g., an active digit line). The other conductive line can be a reference digit line or an offset cancellation (OC) digit line. In some previous approaches, the reference digit line or the OC digit line is a conductive line to which a memory cell is not coupled. For example, a dedicated voltage supply may be coupled to the reference digit line to provide a reference voltage or a dedicated capacitor may be coupled to the OC digit line for offset cancellation. Some memory array architectures may include every digit line having at least one memory cell such that none of the digit lines may be coupled to, for example, a dedicated voltage supply for a reference digit line or a dedicated capacitor for an OC digit line.

Memory cells, such as one transistor, one capacitor (1T1C) DRAM cells, include at least one transistor (e.g., an access device) and at least one capacitor. Typically, the capacitor of a memory cell is used for storage of a data value where the amount of electric charge held by the capacitor, which can be read as a voltage, corresponds to the data value. The capacitor of a memory can be used to provide capacitance, such as an OC capacitance, or to provide a reference voltage, rather than for storage of a data value. As used herein, "storage memory cells" refer to memory cells that are used for storage of data values whereas "offset memory cells" refer to memory cells used to provide an offset capacitance and/or a reference voltage. In memory array architectures where every digit line is coupled to at least one memory cell, the memory cells coupled to at least one of the digit lines can be offset memory cells. For example, the cumulative capacitance of one or more offset memory cells can be used for OC capacitance. One or more offset memory cells can capacitively hold a reference voltage. Offset memory cells can have the same structure as storage memory cells such that no changes to the fabrication of the memory cells and/or a memory array may be needed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more", e.g., a number of sections of memory arrays, can refer to one or more of such sections, whereas a "plurality of" is intended to refer to more than one of such things. Furthermore, the words "can" and "may" are used throughout this application in a permissive sense, i.e., having the potential to, being able to, not in a mandatory sense, i.e., must. The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 568 may reference element "68" in FIG. 1, and a similar element may be referenced as 668 in FIG. 6. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Figure 1:
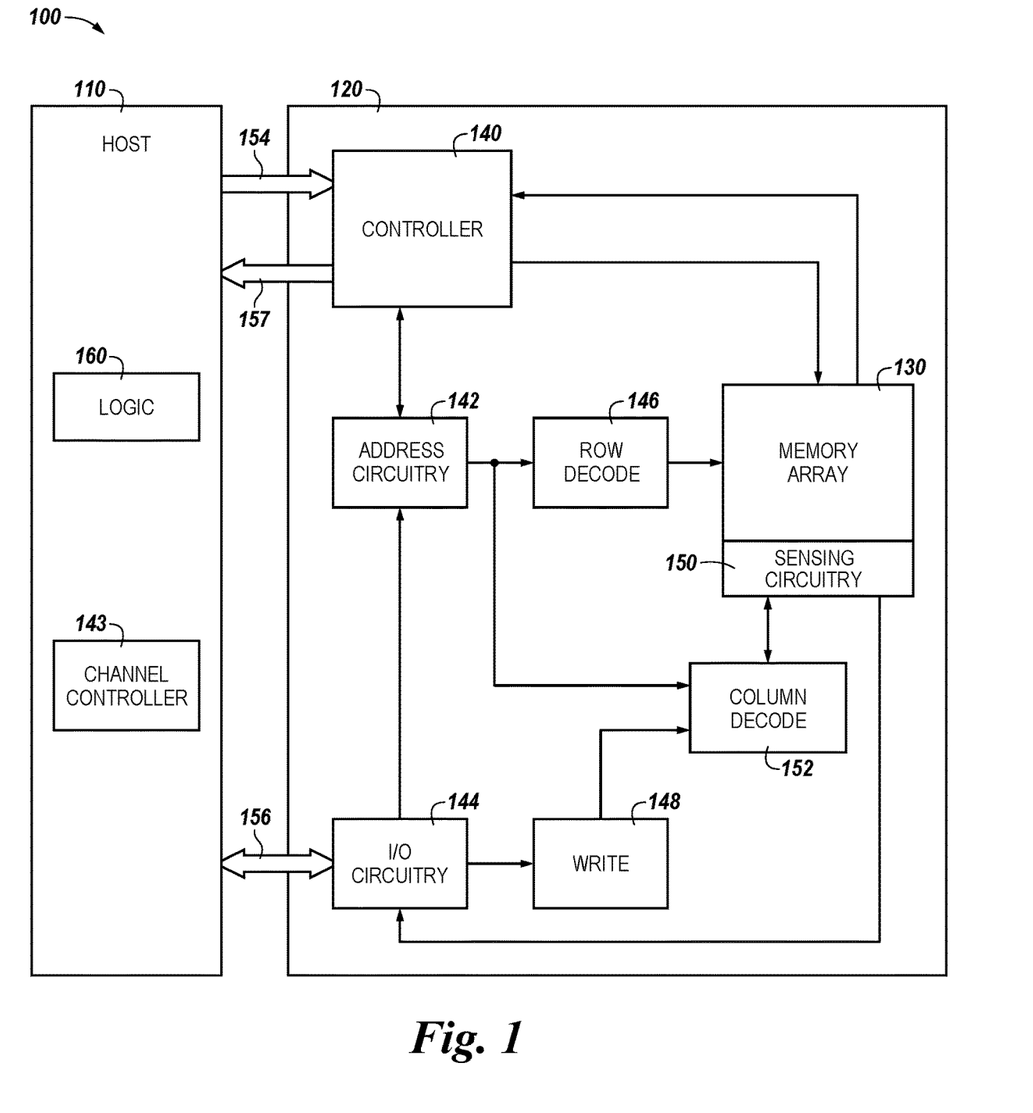
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, and/or sensing circuitry 150 might also be separately considered an "apparatus."

The system 100 includes a host 110 coupled (e.g., connected) to a memory device 120, which includes the memory array 130. The host 110 can be a host system such as a personal laptop computer, a desktop computer, a digital camera, a smart phone, or a memory card reader, among various other types of hosts. The host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 includes storage memory cells and offset memory cells. The memory array 130 can be a DRAM array (e.g., a 3D DRAM array), SRAM array, STT RAM array, PCRAM array, TRAM array, RRAM array, NAND flash array, and/or NOR flash array, for instance. The memory array 130 can comprise storage memory cells and offset memory cells arranged in rows coupled by word lines, which may be referred to herein as access lines or select lines, and columns coupled by digit lines, which may be referred to herein as data lines or sense lines. The memory array 130 may be referred to herein as an array of memory cells. Although a single memory array 130 is shown in FIG. 1, embodiments are not so limited. For instance, the memory device 120 may include a number of the memory arrays 130 (e.g., a number of banks of DRAM cells). In some embodiments, the memory array 130 can include the sense circuitry 150 in addition to the memory cells arranged in rows coupled by word lines and columns coupled by digit lines.

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through the address circuitry 142 and decoded by a row decoder 146 and a column decoder 152 to access the memory array 130. Data can be read from the memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with the host 110 over the data bus 156. The write circuitry 148 can be used to write data to the memory array 130.

The controller 140 (e.g., memory controller) decodes signals provided by a control bus 154 from the host 110. These signals can include chip enable signals, write enable signals, and address latch signals that are used to control operations performed on the memory array 130, including data read, data write, and data erase operations. The controller 140 can selectively couple (e.g., activate) the capacitor(s) of one or more offset memory cells to a reference digit line or an OC digit line by applying signals to the access device(s) (e.g., transistor(s)) of the offset memory cells. The signals can be applied to the access device(s) of the offset memory cells via the word line to which the offset memory cells are coupled.

In various embodiments, the controller 140 is responsible for executing instructions from the host 110 and sequencing access to the memory array 130. The controller 140 can be a state machine, sequencer, or some other type of controller, and include hardware and/or firmware (e.g., microcode instructions) in the form of an application specific integrated circuit (ASIC), field programmable gate array, etc. As described further below, the sensing circuitry 150 and/or the memory array 130 can include one or sense amplifiers.

Figure 2:
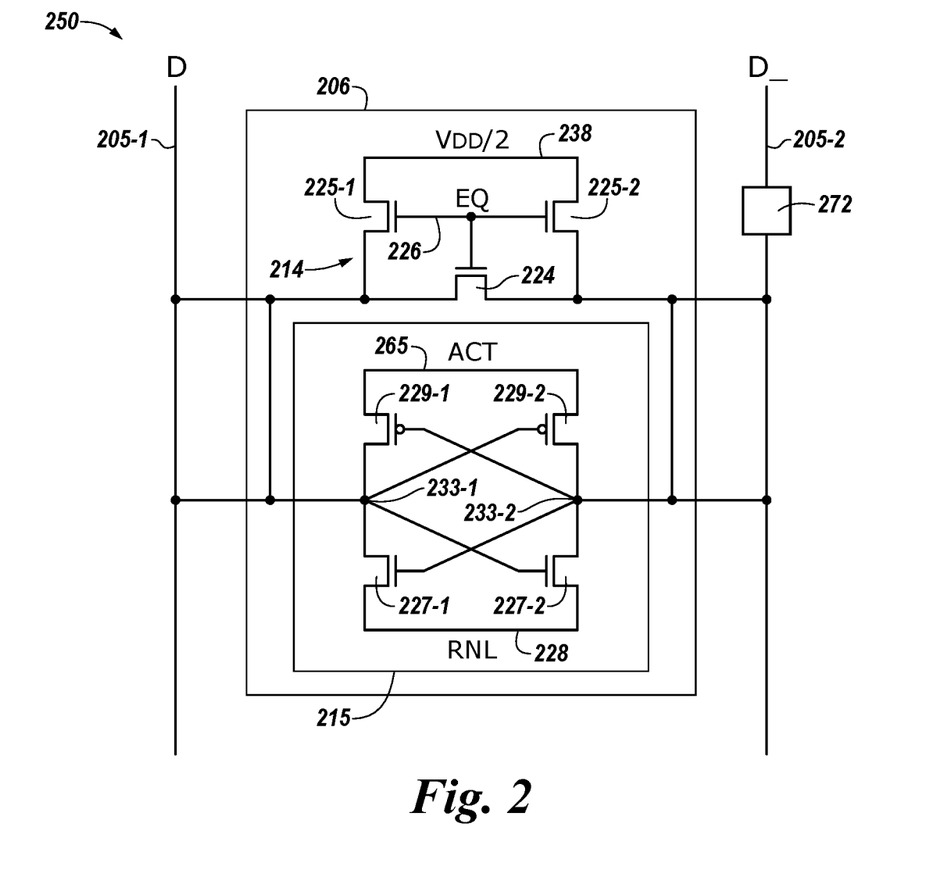
FIG. 2 is a schematic diagram illustrating sensing circuitry in accordance with a number of embodiments of the present disclosure.

FIG. 2 is a schematic diagram illustrating sensing circuitry 250 in accordance with a number of embodiments of the present disclosure. A sense amplifier 206 is coupled to a respective pair of complementary digit lines 205-1 and 205-2. Complementary memory cells can be coupled to pairs of complementary digit lines 205-1 and 205-2 (e.g., as columns). A memory cell can comprise a transistor and a capacitor. The memory cells can be, for example, 1T1C DRAM cells each comprising a storage element, such as a capacitor, and an access device, such as a transistor. In a number of embodiments, the memory cells may be destructive read memory cells such that reading the data stored in the cell destroys the data; however, the data originally stored in the cell may be refreshed after being read.

Memory cells can be coupled to different digit lines and/or word lines. For example, a first source/drain region of an access transistor of a memory cell can be coupled to a digit line 205-1 (D), a second source/drain region of the access transistor of the memory cell can be coupled to a capacitor of the memory cell, and a gate of the access transistor of the memory cell can be coupled to a word line of the memory array.

A data storage state can include the sense amplifiers 206 storing a data value. As used herein, a data value can be referred to as a bit, which is an abbreviation of "binary digit." In a number of embodiments, the sense amplifier 206 can be in at least one of two states associated with a first mode and a second mode. As used herein, a state of the sense amplifier 206 can describe a transfer of data to or from the sense amplifier 206. The state of the sense amplifier 206 can also be described as whether the sense amplifier 206 is in an equilibration state or is storing a data value, e.g., a binary 0 or 1. For example, the sense amplifier 206 can be configured to be in an initial state, wherein the initial state is one of an equilibration state and a data storage state.

As shown in FIG. 2, the sensing circuitry 250 can comprise a sense amplifier 206 corresponding to a respective column of memory cells that are coupled to the pair of complementary digit lines 205-1 and 205-2. The sense amplifier 206 can include a cross coupled latch. According to various embodiments, a sense amplifier 206 can comprise a cross coupled latch. However, embodiments of the sense amplifier 206 are not limited to a cross coupled latch. For example, the sense amplifier 206 in FIG. 2 can be current-mode sense amplifier and/or single-ended sense amplifier (the sense amplifier 206 is coupled to one digit line). Embodiments of the present disclosure also are not limited to a folded data line architecture.

The sense amplifier 206 comprises a latch 215 including four transistors coupled to a pair of complementary digit lines D 205-1 and D_ 205-2. As shown in FIG. 2, the latch 215 can be a cross coupled latch so that the gates of a pair of transistors, such as n-channel transistors 227-1 and 227-2, can be cross coupled with the gates of another pair of transistors, such as p-channel transistors 229-1 and 229-2. The n-channel transistors 227-1 and 227-2 can be NMOS transistors and the p-channel transistors 229-1 and 229-2 can be PMOS transistors.

The voltages and/or currents on the respective digit lines 205-1 and 205-2 can be provided to the respective latch inputs 233-1 and 233-2 of the cross coupled latch 215. The latch input 233-1 is coupled to a first source/drain region of the transistors 227-1 and 229-1 and the gates of the transistors 227-2 and 229-2. Similarly, the latch input 233-2 is coupled to a first source/drain region of the transistors 227-2 and 229-2 and the gates of the transistors 227-1 and 229-1.

A second source/drain region of the transistors 227-1 and 227-2 is commonly coupled to a negative control signal (RNL) 228. A second source/drain region of the transistors 229-1 and 229-2 is commonly coupled to an active positive control signal (ACT) 265. The ACT control signal 265 can be a supply voltage, e.g., $V_{DD}$, and the RNL control signal 228 can be a reference voltage, e.g., ground. The RNL control signal 228 and the ACT control signal 265 can function as activating signals that enable the cross coupled latch 215.

The latch input 233-1 can be coupled to one or more storage memory cells (e.g., one or more memory cells coupled to the active digit line 205-1). The latch input 233-2 can be coupled to one or more offset memory cells (e.g., one or more memory cells coupled to the reference digit line 205-2). The offset memory cells can be pre-charged to the reference voltage using an existing supply voltage of the memory array (e.g., $V_{DD}$).

The enabled cross coupled latch 215 can operate to amplify a differential voltage between the latch input 233-1, (a first common node) and the latch input 233-2 (a second common node) such that the latch input 233-1 is driven to one of the ACT signal voltage 265 (e.g., a supply voltage $V_{DD}$) and the RNL signal voltage 228 (e.g., ground) and the latch input 233-2 is driven to the other one of the ACT signal voltage 265 and the RNL signal voltage 228. The ACT signal voltage 265 and the RNL signal voltage 228 can correspond to the full rail voltages for conversion of the sensed voltages from the pair of complementary memory cells to a data value, e.g., a binary 0 or 1 data value, by determination of the voltage differential for a read operation, among other possible operations.

The sense amplifier 206 may also include equilibrate circuitry 214 configured to equilibrate sense line 205-1 and sense line 205-2. However, embodiments of the sense amplifier 206 are not limited to including the equilibrate circuitry 214. As shown in FIG. 2, the equilibrate circuitry 214 can include a transistor 224 having a first source/drain region coupled to a first source/drain region of a transistor 225-1 and the digit line 205-1. A second source/drain region of the transistor 224 is coupled to a first source/drain region of a transistor 225-2 and the digit line 205-2. A gate of the transistor 224 is coupled to gates of the transistors 225-1 and 225-2.

The second source/drain regions of the transistors 225-1 and 225-2 are coupled to an equilibration voltage 238 (e.g., $V_{DD}/2$). The gates of the transistors 224, 225-1, and 225-2 are coupled to the equilibrate (EQ) control signal 226. Activating the EQ control signal enables the transistors 224, 225-1, and 225-2, which can effectively short the digit line 205-1 to the digit line 205-2. Shorting the digit lines 205-1 and 205-2 can substantially equilibrate the digit lines 205-1 and 205-2 to the equilibration voltage 238. The sense amplifier 206 can be enabled to sense and/or store voltage potentials from two complementary memory cells coupled to the digit lines 205-1 and 205-2.

In some previous approaches, the digit line 205-2, for example, of the complementary pair may be coupled to a dedicated voltage supply to provide a reference voltage. In contrast, at least one embodiment in accordance with the present disclosure includes using offset memory cells, represented by the box 272, coupled to the digit line 205-2 to capacitively hold a reference voltage. The offset memory cells at 272 coupled to the digit line 205-2 can be pre-charged with a supply voltage of the memory array (e.g., $V_{DD}$). Using offset memory cells to capacitively hold a reference voltage eliminates the need for the dedicated voltage supply. The reference voltage held capacitively by the offset memory cells can be used to sense a data value from a storage memory cell coupled to the digit line 205-1.

Figure 3:
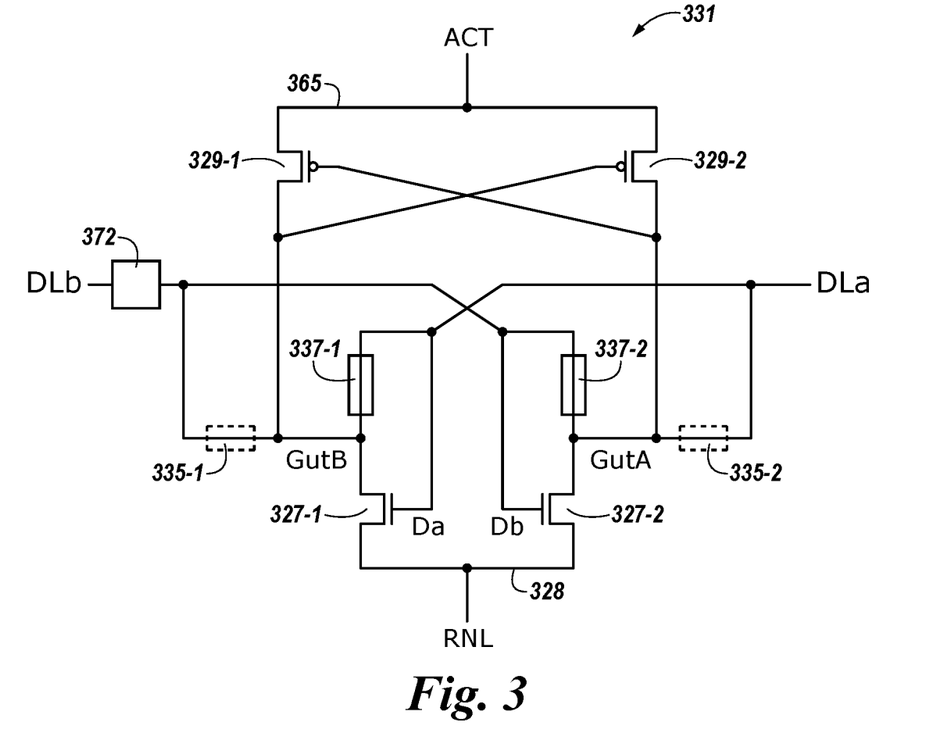
FIG. 3 is a schematic diagram illustrating a threshold voltage (Vt) compensating (VTC) sense amplifier in accordance with a number of embodiments of the present disclosure.

FIG. 3 is a schematic diagram illustrating a VTC sense amplifier 331 in accordance with a number of embodiments of the present disclosure. The transistors 327-1, 327-2, 329-1, and 329-2; the ACT control signal 365; and the RNL control signal 328 shown in FIG. 3A can be analogous to the transistors 227-1, 227-2, 229-1, and 229-2; the ACT control signal 265; and the RNL control signal 228 shown in FIG. 2.

As shown in FIG. 3, the VTC sense amplifier 331 includes ISO switch NMOS 335-1 and 335-2 and diode switch NMOS 337-1 and 337-2. The ISO switch NMOS 335-1 is coupled to a first digit line DLb of a memory array (e.g., the memory array 130 illustrated in FIG. 1), source/drain regions of the transistors 329-1 and 327-1, and the gate of the transistor 329-2. The ISO switch NMOS 335-2 is coupled to a second digit line DLa of the memory array, source/drain regions of the transistors 329-2 and 327-2, and the gate of the transistor 329-1. GutA is a first digit line of the VTC sense amplifier 331 and GutB is a second digit line of the VTC sense amplifier 331. The diode switch NMOS 337-1 is coupled to a source/drain region of the transistor 327-1, the gate of the transistor 327-1, and the digit line DLa. The diode switch NMOS 337-2 is coupled to a source/drain region of the transistor 327-2, the gate of the transistor 327-2, and the digit line DLb.

The VTC sense amplifier 331 stores a Vt offset cancellation voltage on a digit line of a memory array (e.g., the digit line DLb) via the capacitance of the digit line. In some previous approaches, the VTC sense amplifier 331 may be coupled to a digit line of the memory array to which no memory cells are coupled. The capacitance of that digit line (e.g., the digit line DLb) is used to offset the capacitance of the (active) digit line (e.g., the digit line DLa) coupled to a memory cell from which a data value is being sensed.

In contrast, at least one embodiment in accordance with the present disclosure includes using offset memory cells, represented by the box 372, coupled to the digit line DLb to provide the offset capacitance. During a compensation phase of a sensing operation performed by the VTC sense amplifier in accordance with the present disclosure, the offset memory cells at 472 coupled to the digit line DLb can be isolated from the digit line GutB of the VTC sense amplifier 331 and the storage memory cells coupled to the digit line DLa can be isolated from the digit line GutA of the VTC sense amplifier 331. During the compensation phase, the offset memory cells at 472 coupled to the digit line DLb can be coupled to the digit line GutA of the VTC sense amplifier 331 and the storage memory cells coupled to the digit line DLa can be coupled to the digit line GutB of the VTC sense amplifier 331.

Prior to the compensation phase, at least one embodiment can include one or more offset memory cells at 372 can be selectively coupled to the digit line DLb of the memory array as described in association with FIG. 5 below.

Figure 4:
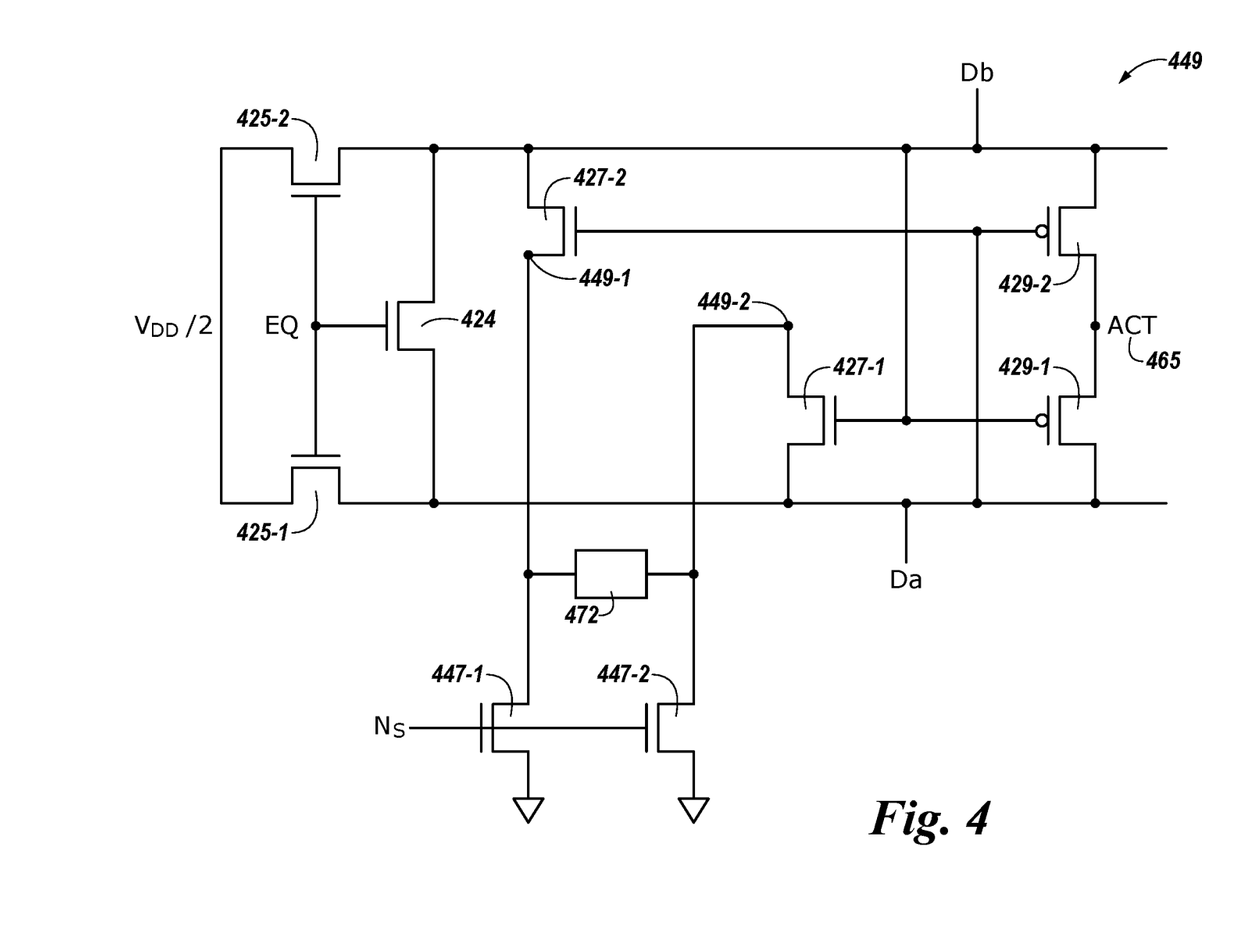
FIG. 4 is a schematic diagram illustrating an offset canceling sense amplifier (OCSA) in accordance with a number of embodiments of the present disclosure.

FIG. 4 is a schematic diagram illustrating a previous approach to an OC sense amplifier (OCSA) 449. The transistors 424, 425-1, 425-2, 427-1, 427-2, 429-1, and 429-2, and the ACT control signal 465 shown in FIG. 4 can be analogous to the transistors 224, 225-1, 225-2, 227-1, 227-2, 229-1, and 229-2, and the ACT control signal 265 shown in FIG. 2. The OCSA 449 is a coupled to a first digit line Da of a memory array (e.g., the memory array 130 illustrated in FIG. 1) coupled to a storage memory cell from which a data value is being sensed (e.g., an active digit line). A source/drain region of the transistor 445-2 is coupled to the digit line Db. A first source/drain region of a transistor 447-1 is coupled to ground, a second source/drain region of the transistor 447-1 is coupled to an RNL node 449-1, and the gate of the transistor 447-1 coupled to an NSA enable signal. The RNL node 449-2 is coupled to a source/drain region of the transistor 427-2. A first source/drain region of a transistor 447-2 is coupled to an RNL node 449-2, a second source/drain region of the transistor 447-2 is coupled to ground, and the gate of the transistor 447-2 is coupled to the NSA enable signal.

In some previous approaches, a dedicated OC capacitor may be coupled to the RNL nodes 449-1 and 449, a source/drain region of the transistor 447-1, and a source/drain region of the transistor 447-2. In contrast, one or more offset memory cells (represented by the box 472) coupled to an OC digit line are coupled to the RNL nodes 449-1 and 449-2 and a source/drain region of each of the transistors 447-1 and 447-2. The offset memory cell(s) at 472 effectively replaces a dedicated OC capacitor.

In at least one embodiment in accordance with the present disclosure, at a first time, the transistors 447-1 and 447-2 are enabled to place a voltage across the offset memory cells at 472 that is dependent upon the offset voltage present in each of the transistors 427-1 and 427-2. The transistors 447-1 and 447-2 can be enabled slightly at the first time. At a second time that is subsequent to the first time, the transistors 447-1 and 447-2 are disabled but the local RNL nodes 449-1 and 449-2 maintain the offset voltage via the offset memory cells at 472. At a third time that is subsequent to the second time and concurrent with sensing a data value from a storage memory cell coupled to the OCSA 449, the transistors 447-1 and 447-2 are enabled. The one of the transistors 427-1 and 427-2 having the highest offset voltage starts out closest to ground and the other one of the transistors 427-1 and 427-2 having the lowest offset voltage starts out farthest from ground, thereby compensating for the NSA offset voltages.

As described further in association with FIGS. 5 and 6 below, one or more offset memory cells at 472 can be selectively coupled to the OC digit line and/or one or more offset memory cells can be permanently coupled to the OC digit line.

Figure 5:
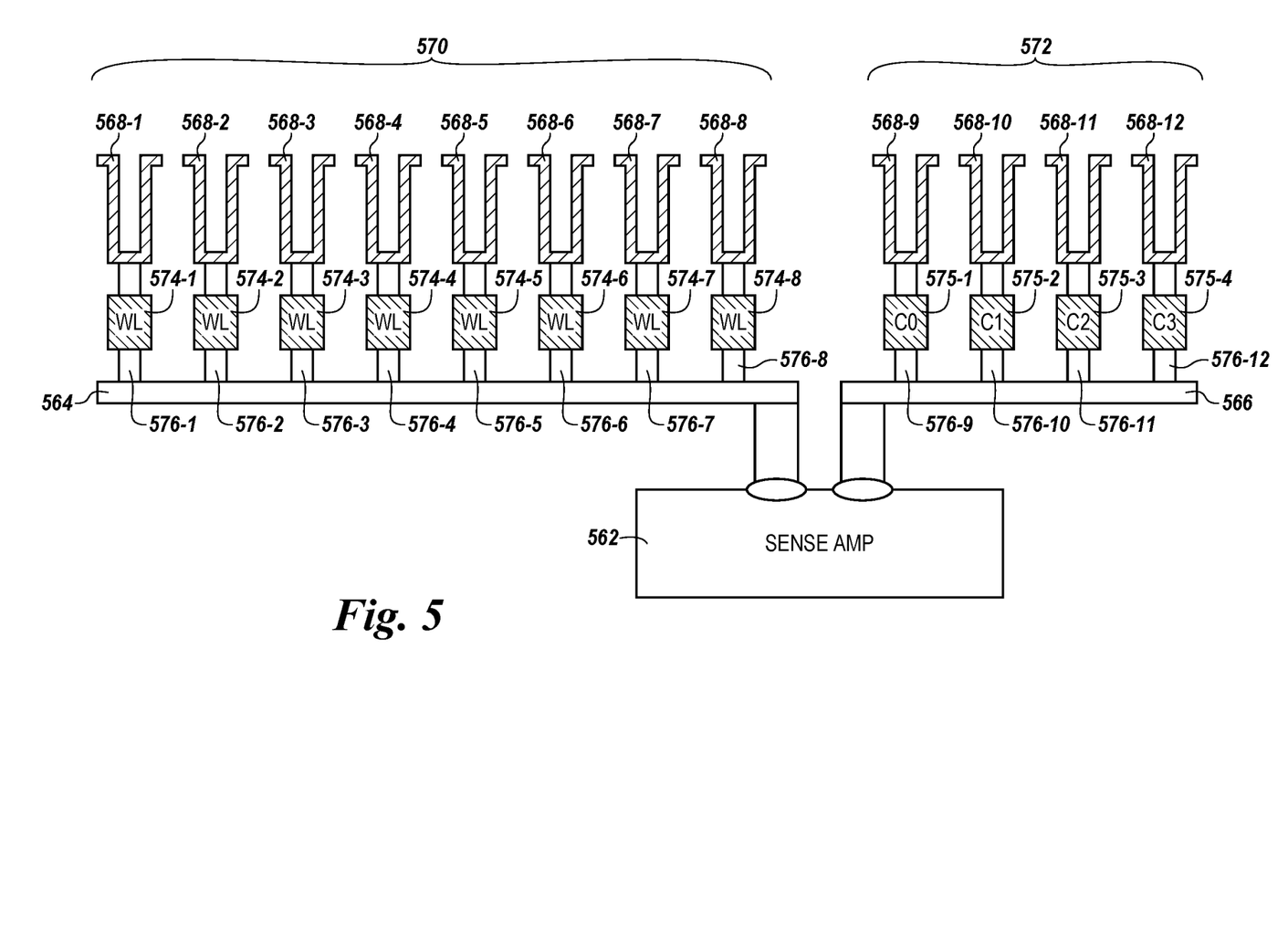
FIG. 5 is a schematic diagram illustrating an array of storage memory cells and an array of offset memory cells in accordance with a number of embodiments of the present disclosure.

FIG. 5 is a schematic diagram illustrating an array 570 of storage memory cells and an array 572 of offset memory cells in accordance with a number of embodiments of the present disclosure. The array 570 of storage memory cells and the array 572 of offset memory cells can each be a subset of a memory array, such as the array 130 illustrated in FIG. 1. The array 572 of offset memory cells can be analogous to the offset memory cells illustrated at 272 in FIG. 2, at 372 in FIG. 3, and at 472 at FIG. 4. A first plurality of memory cells 568-1, 568-2, 568-3, 568-4, 568-5, 568-6, 568-7, and 568-8 are coupled to a first conductive line (e.g., an active digit line) 564. The memory cells 568-1, 568-2, 568-3, 568-4, 568-5, 568-6, 568-7, and 568-8 are storage memory cells and can comprise an array 570 of storage memory cells. Although FIG. 5 shows eight storage memory cells coupled to the first conductive line 564, the array 570 of storage memory cells can include less than or greater than eight storage memory cells. Each of the storage memory cells 568-1, 568-2, 568-3, 568-4, 568-5, 568-6, 568-7, and 568-8 can be coupled to the first conductive line 564 via a respective access device 576-1, 576-2, 576-3, 576-4, 576-5, 576-6, 576-7, and 576-8 (collectively referred to as access devices 576). The access devices 576 can be a respective transistor of the storage memory cells 568-1, 568-2, 568-3, 568-4, 568-5, 568-6, 568-7, and 568-8. Each of the access devices 576 can be coupled to a respective word line 574-1, 574-2, 574-3, 574-4, 574-5, 574-6, 574-7, and 574-8.

A second plurality of memory cells 568-9, 568-10, 568-11, and 568-12 are coupled to a second conductive line 566. The second plurality of memory cells 568-9, 568-10, 568-11, and 568-12 are offset memory cells and can comprise an array 572 of offset memory cells. The second conductive line 566 can be an offset compensation digit line or a reference digit line depending on the type of a sense amplifier 562 coupled to the first conductive line 564 and the second conductive line 566. The sense amplifier 562 can be analogous to any of the sensing circuitry illustrated in FIGS. 2-4 described above. Although FIG. 5 shows four offset memory cells coupled to the second conductive line 566, the array 572 of offset memory cells can include less than or greater than four memory cells.

Each of the offset memory cells 568-9, 568-10, 568-11, and 568-12 can be coupled to the second conductive line 566 via a respective access device 576-9, 576-10, 576-11, and 576-12. The access devices 576 can be a respective transistor of the offset memory cells 568-9, 568-10, 568-11, and 568-12. Each of the access devices 576 coupled to the offset memory cells 568-9, 568-10, 568-11, and 568-12 are coupled to a respective one of the control lines 575-1 (C0), 575-2 (C1), 575-3 (C2), and 575-4 (C3). The control lines 575-1, 575-2, 575-3, and 575-4 can be wordlines. A subset of the memory cells 568-9, 568-10, 568-11, and 568-12 can be selectively coupled to the second conductive line 566 by enabling and/or disabling the gates of the respective access devices 576.

At least one embodiment in accordance with the present disclosure includes selectively coupling one or more offset memory cells (e.g., the offset memory cells 568-9, 568-10, 568-11, and 568-12) to the second conductive line 566 to determine the quantity of offset memory cells are needed to offset the capacitance of the first conductive line 564. After selectively coupling the offset memory cells, the data value sensed by the sense amplifier 562 can be compared to an expected data value to determine whether the cumulative capacitance of the selectively coupled offset memory cells offset the capacitance of the first conductive line 564.

In at least one embodiment, the array 570 and the array 572 can each be a three-dimensional (3-D) array of memory cells. The access devices 576 can be vertical pillar access devices. The sense amplifier 562 can be formed in CMOS under the array 570 and/or the array 572. Although not shown in FIG. 5, a first cell plate can be coupled to the storage memory cells 568-1, 568-2, 568-3, 568-4, 568-5, 568-6, 568-7, and 568-8 and a second cell plate can be coupled to the offset memory cells 568-9, 568-10, 568-11, and 568-12 of the second array 572. The same cell plate can be coupled to the storage memory cells 568-1, 568-2, 568-3, 568-4, 568-5, 568-6, 568-7, and 568-8 and the offset memory cells 568-9, 568-10, 568-11, and 568-12.

In at least one embodiment, the number of offset memory cells in the array 572 can be dependent on the cumulative capacitance to offset the capacitance of the first conductive line 564. For example, if the capacitance of the capacitor of each of the memory cells 568 is approximately four to five femtofarads (fF) and the capacitance of the first conductive line 564 is approximately fifteen to twenty-five fF, then four to five offset memory cells coupled to the second conductive line 566 will offset the capacitance of the first conductive line 564. The offset memory cells of the array 572 can be selectively coupled to the second conductive line 566 to provide various amounts of offset capacitance. The cumulative capacitance of the offset memory cells is dependent on the number of offset memory cells coupled to the second conductive line 566. Control signals can be applied to the control lines 575-1, 575-2, 575-3, and 575-4 to selectively activate the corresponding offset memory cells 568-9, 568-10, 568-11, and 568-12. The control signals can be signals (e.g., word line drivers) that a controller (e.g., 140 shown in FIG. 1) coupled to the memory array (e.g., 140 shown in FIG. 1) is already configured to provide. That is, the control signals applied to the control lines 575-1, 575-2, 575-3, and 575-4 are not additional signals for the controller 140 to provide.

The array 572 of offset memory cells can be used to provide a reference voltage. In at least one embodiment, the array 572 of offset memory cells can serve as a "fat" capacitor for a voltage supply. For example, the sense amplifier 215 shown in FIG. 2 can be coupled to a reference digit line (e.g., 205-2) that is coupled to the array 572 of offset memory cells as represented by the box 272. The digit line 205-2 can be analogous to the second conductive line 566. The offset memory cells 568-9, 568-10, 568-11, and 568-12 can be pre-charged with a supply voltage. Depending on the magnitude of the reference voltage used by the sense amplifier 215, one or more of the pre-charged offset memory cells 568-9, 568-10, 568-11, and 568-12 can be selectively coupled to the digit line 205-2.

The digit line DLb of the VTC sense amplifier 331 shown in FIG. 3 can be coupled to the array 572 of offset memory cells as represented by the box 372. The digit line DLa can be analogous to the first conductive line 564 and the digit line DLb can be analogous to the second conductive line 566. To offset the capacitance of the first conductive line 564 (e.g., an active digit line), one or more of the offset memory cells 568-9, 568-10, 568-11, and 568-12 can be selectively coupled to the second conductive line 566. The offset memory cells 568-9, 568-10, 568-11, and 568-12 selectively coupled to the second conductive line 566 effectively replace a digit line of the memory array to which no memory cells are coupled in previous approaches. The cumulative capacitance of offset memory cells 568-9, 568-10, 568-11, and 568-12 selectively coupled to the second conductive line 566 can be equal to the capacitance of the first conductive line 564.

The offset memory cells can be used to provide an offset capacitance. For example, the OCSA 449 shown in FIG. 4 can include the array 572 of offset memory cells as represented by the box 472. To offset the capacitance of the first conductive line 564 (e.g., an active digit line), one or more of the offset memory cells 568-9, 568-10, 568-11, and 568-12 can be selectively coupled to the second conductive line 566 (e.g., an OC digit line). The offset memory cells 568-9, 568-10, 568-11, and 568-12 selectively coupled to the second conductive line 566 effectively replace a dedicated OC capacitor in previous approaches. The cumulative capacitance of offset memory cells 568-9, 568-10, 568-11, and 568-12 selectively coupled to the second conductive line 566 can be equal to the capacitance of the first conductive line 564.

In at least one embodiment in accordance with the present disclosure, the memory array (e.g., the memory array 130 shown in FIG. 1) has a 1T1C DRAM architecture. The 1T1C DRAM architecture can include sections where digit lines coupled to the sense amplifiers of a first sensing component stripe adjacent to a section of the memory array are interlaced (e.g., alternating) with digit lines coupled to the sense amplifiers of a second sensing component stripe that is adjacent to the section. For example, when a row of the memory array is selected and opened (fired by execution of a fire row command, for example) the sense amplifiers of the first sensing component stripe and the sense amplifiers of the second sensing component stripe can be enabled to sense and/or store voltage potentials from two portions of the digit lines coupled to each of the sense amplifiers of the first and second sensing component stripes.

Portions of the digit lines coupled to the sense amplifiers of the first sensing component stripe that intersect with the selected row extend (e.g., upward) through a first section of the memory array toward a row of a second section of the memory array adjacent to the first sensing component stripe, where the digit line may be selectably coupled to a particular 1T1C memory cell. A complementary portion of each of the digit lines coupled to the sense amplifiers of the first sensing component stripe extend (e.g., downward) into the second section. The complimentary portion can be used by the sense amplifiers of the first sensing component stripe to sense a reference voltage (e.g., residual) on the digit line when the digit line is not coupled to a memory cell in the second section. The reference voltage on the portion of the digit lines coupled to the sense amplifiers of the first sensing component stripe that extend into the second section can be used as a reference to determine a data value corresponding to the voltage sensed on the memory cells of the selected row in the first section.

In some embodiments, utilization of adjacent (e.g., neighboring) sections for reference digit lines may continue throughout a memory array. However, such an architecture may present an issue at the edge of memory arrays because there is no adjacent section on an edge of the memory array. Therefore, half of the digit lines of a section at the edge of a memory array may not utilized in the same manner as the digit lines of sections of a memory array not at the edge of the memory array. In some previous approaches, a lack of an adjacent section of a memory array at an edge of the memory array may result in half the various memory elements associated with the section at the edge, as formed by an automated fabrication process, not being utilized.

In contrast, at least one embodiment in accordance with the present disclosure includes a sensing component stripe at the edge of a memory array where each sense amplifier (e.g., the sense amplifier 562) of the sensing component stripe at the edge (hereinafter referred to as edge sense amplifiers) is coupled to the previously non-utilized digit lines of the section of the memory array at the edge of the memory array. As shown in FIG. 5, storage memory cells (e.g., the array 570 of storage memory cells) are coupled to one of the previously non-utilized digit lines coupled to each respective edge sense amplifier. Offset memory cells (e.g., the array 572 of offset memory cells) are coupled to another one of the previously non-utilized digit lines coupled to each respective edge sense amplifier.

A reference voltage (e.g., residual) can be held capacitively by the offset memory cells. The sense amplifiers of the sensing component stripe at the edge of the memory array can sense the reference voltage held capacitively by the offset memory cells that are enabled (e.g., coupled to a respective one of the digit lines), via access devices of the offset memory cells, while the storage memory cells are disabled (e.g., not coupled to the respective one of the digit lines), via access devices of the storage memory cells. The offset memory cells can be disabled (e.g., not coupled to the respective one of the digit lines), via access devices of the offset memory cells, and the storage memory cells can be enabled (e.g., coupled to the respective one of the digit lines), via access devices of the storage memory cells, to sense a data value can be sensed from the storage memory cells using the sensed reference voltage. Thus, the addition of the sense amplifiers 562 at an edge of a memory array enables utilization of all the digit lines of a section of the memory array at the edge of the memory array, and utilization of more than half the various memory elements associated with the section at the edge as storage memory cells.

Figure 6:
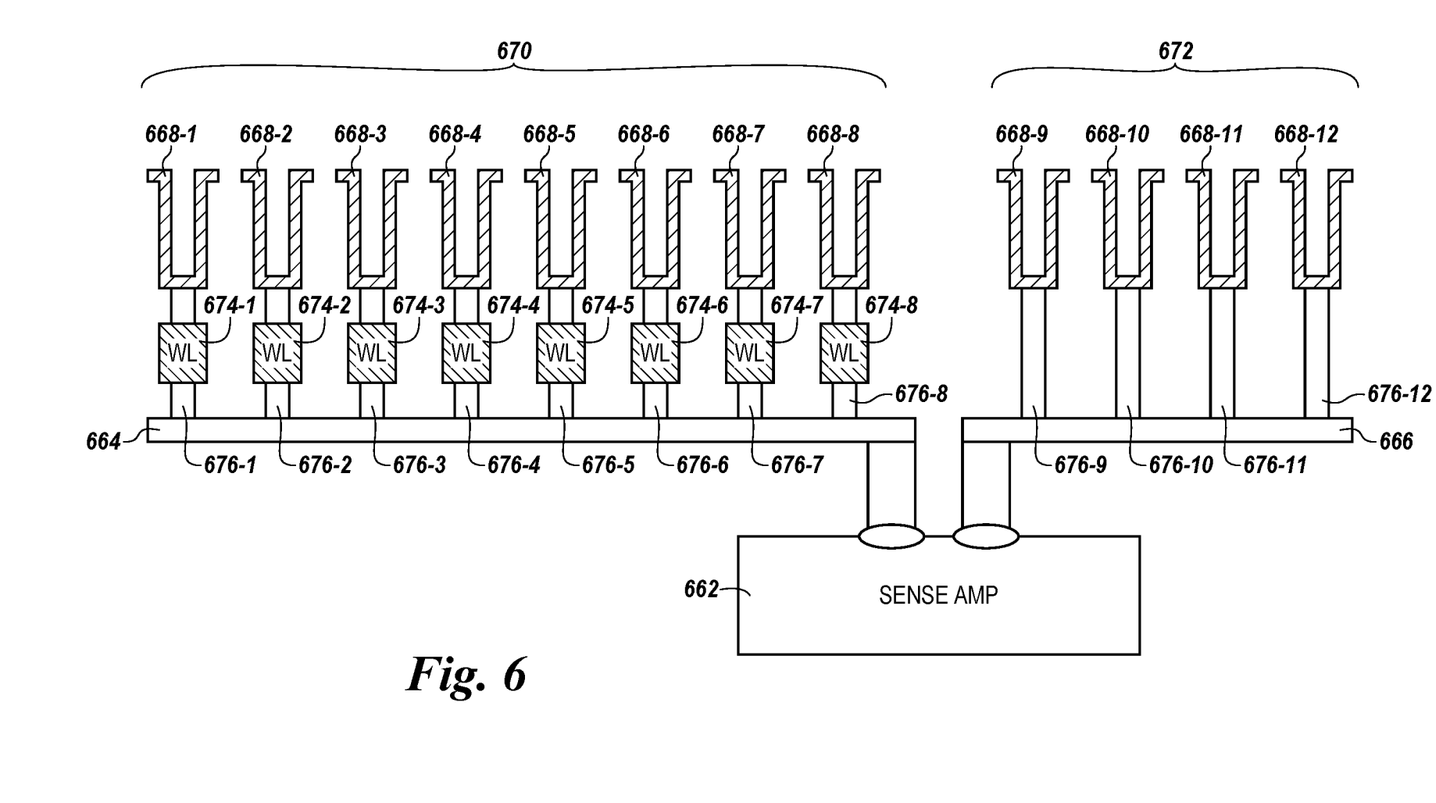
FIG. 6 is a schematic diagram illustrating storage memory cells and offset memory cells where the offset memory cells are permanently coupled to a conductive line in accordance with a number of embodiments of the present disclosure.

FIG. 6 is a schematic diagram illustrating storage memory cells 668-1, 668-2, 668-3, 668-4, 668-5, 668-6, 668-7, and 668-8 and offset memory cells 668-9, 668-10, 668-11, and 668-12 where the offset memory cells are permanently coupled to a conductive line in accordance with a number of embodiments of the present disclosure. The storage memory cells 668-1, 668-2, 668-3, 668-4, 668-5, 668-6, 668-7, and 668-8; the offset memory cells 668-9, 668-10, 668-11, and 668-12; the first array 670; the second array 672; the access devices 676; the word lines 674; the first conductive line 664; the second conductive line 666; and the sense amplifier 662 shown in FIG. 6 can be analogous to the storage memory cells 568-1, 568-2, 568-3, 568-4, 568-5, 568-6, 568-7, and 568-8; the offset memory cells 568-9, 568-10, 568-11, and 568-12; the first array 570; the second array 572; the access devices 576; the word lines 574; the first conductive line 564; the second conductive line 566; and the sense amplifier 562 shown in FIG. 5. The array 672 of offset memory cells can be analogous to the offset memory cells illustrated at 272 in FIG. 2, at 372 in FIG. 3, and at 472 at FIG. 4.

As illustrated in FIG. 6, the offset memory cells 668-9, 668-10, 668-11, and 668-12 of the second array 672 can be directly coupled to the second conductive line 666. For example, the access devices 676 coupled to the offset memory cells 668-9, 668-10, 668-11, and 668-12 can be shorted to permanently couple the offset memory cells 668-9, 668-10, 668-11, and 668-12 to the second conductive line 666.

Figure 7:
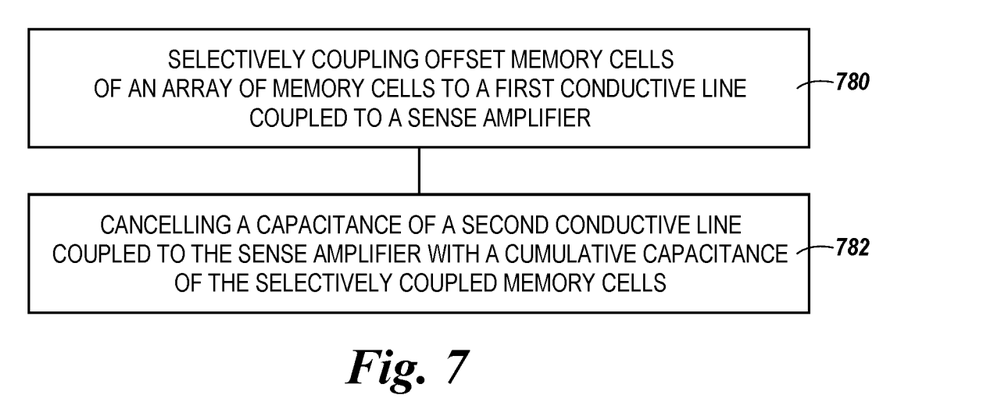
FIG. 7 is a flow diagram for a method in accordance with a number of embodiments of the present disclosure.

FIG. 7 is a flow diagram for a method in accordance with a number of embodiments of the present disclosure. At 780, the method includes selectively coupling memory cells of an array of memory cells to a first conductive line coupled to a sense amplifier. At 782, the method includes cancelling a capacitance of a second conductive line coupled to the sense amplifier with a cumulative capacitance of the selectively coupled memory cells.

Selectively coupling the memory cells can include enabling word line drivers associated with the selectively coupled memory cells. The method can include selectively coupling the memory cells such that a cumulative capacitance of the selectively coupled memory cells is approximately equal to the capacitance of the second conductive line. Offsetting a voltage differential of the sense amplifier (e.g., the voltage differential between the transistors 427-1 and 427-2 of the OCSA 449 illustrated in FIG. 4) can include enabling a pair of transistors, at a first time, to place a voltage across the selectively coupled offset memory cells and disabling the pair of transistors, at a second time subsequent to the first time, to maintain the voltage across the offset memory cells. The pair of transistors can be enabled at a third time subsequent to the second time and concurrent with sensing a data value stored in storage memory cells of the array of memory cells coupled to the sense amplifier.

Figure 8:
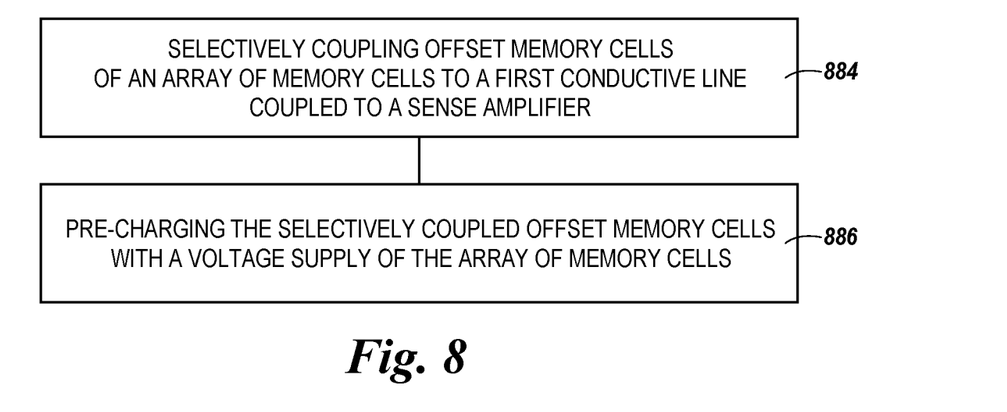
FIG. 8 is a flow diagram for a method in accordance with a number of embodiments of the present disclosure.

FIG. 8 is a flow diagram for a method in accordance with a number of embodiments of the present disclosure. At 884, the method includes selectively coupling offset memory cells of an array of memory cells to a first conductive line coupled to a sense amplifier. At 886, the method includes pre-charging the selectively coupled offset memory cells with a voltage supply of the array of memory cells.

The method can include selectively coupling the offset memory cells such that, when pre-charged with the voltage supply, the selectively coupled memory cells hold capacitively a cumulative voltage that is approximately equal to a reference voltage of the sense amplifier. The method can include sensing, with the sense amplifier and using the cumulative voltage capacitively held by the selectively coupled memory cells, a data value stored in storage memory cells of the array of memory cells coupled to the second conductive line.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a plurality of sense amplifiers, wherein each sense amplifier is coupled to a respective plurality of storage memory cells via a respective first digit line and a respective plurality of offset memory cells via a respective second digit line; and
   a respective plurality of access devices coupled to the respective plurality of offset memory cells and the respective second digit line,
   wherein respective voltages held capacitively by the plurality of storage memory cells correspond to data values, wherein respective voltages held capacitively by the plurality of offset memory cells do not correspond to data values, and wherein the plurality of offset memory cells have a cumulative capacitance that is approximately equal to a capacitance of the first digit line.

2. The apparatus of claim 1, further comprising a memory array including the plurality of sense amplifiers, wherein the plurality of sense amplifiers are located at an edge of the memory array.

3. The apparatus of claim 2, wherein the first and second digit lines are associated with a section of the memory array at the edge of the memory array.

4. The apparatus of claim 1, further comprising a memory array comprising the plurality of sense amplifiers, the respective plurality of storage memory cells, and the respective plurality of offset memory cells.

5. The apparatus of claim 1, wherein each of the storage memory cells and each of the offset memory cells comprise a respective capacitor having a particular capacitance.

6. The apparatus of claim 1, further comprising a controller coupled to the pluralities of access devices and configured to selectively couple at least one of the respective plurality of offset memory cells to the respective second digit line.

7. The apparatus of claim 1, wherein each of the plurality of sense amplifiers is coupled to a respective transistor configured to couple the sense amplifier to the respective second digit line.

8. The apparatus of claim 1, wherein at least one of the offset memory cells is permanently coupled to the respective second digit line.

9. A method, comprising:
   selectively coupling a subset of memory cells of a first plurality of memory cells couplable to a first conductive line of a memory array,
   wherein respective voltages held capacitively by the subset of memory cells do not correspond to data values, and
   wherein a cumulative capacitance of the subset of memory cells is approximately equal to a capacitance of a second conductive line of the memory array;
   sensing, using a sense amplifier coupled to the first and second conductive lines, a respective data value stored by each of a second plurality of memory cells coupled to the second conductive line; and
   offsetting a voltage differential of the sense amplifier with a cumulative voltage held capacitively by the subset of memory cells, wherein offsetting the voltage differential comprises:
      charging the subset of memory cells to the cumulative voltage;
      capacitively holding the cumulative voltage by the subset of memory cells;
      concurrent with sensing the data value, discharging the cumulative voltage from the subset of memory cells
      isolating the subset of memory cells from a first digit line coupled to the sense amplifier; and
      isolating the second plurality of memory cells from a second digit line coupled to the sense amplifier.

10. The method of claim 9, wherein offsetting the voltage differential further comprises:
    coupling the subset of memory cells to the second digit line; and
    coupling the second plurality of memory cells to the first digit line.

11. An apparatus, comprising:
    an array of memory cells, formed on a CMOS layer, comprising:
       a plurality of storage memory cells coupled to a first conductive line, wherein respective voltages held capacitively by the plurality of storage memory cells correspond to data values;
       a plurality of offset memory cells coupled to a plurality of word lines and selectively couplable to a second conductive line via activation of a plurality of vertical pillar access devices,
       wherein the plurality of vertical pillar access devices are activated by application of a signal to the plurality of word lines,
       wherein respective voltages held capacitively by the plurality of offset memory cells do not correspond to data values, and
       wherein a cumulative capacitance of the plurality of offset memory cells offsets a capacitance of the first conductive line; and
       a sense amplifier, formed in the CMOS layer, coupled to the first and second conductive lines; and
    a controller coupled to the array and configured to:
       cause application of the signal to the plurality of word lines to activate the plurality of vertical pillar access devices; and
       cause the sense amplifier to sense a data value from plurality of storage memory cells concurrently with activation of the plurality of vertical pillar access devices.

12. The apparatus of claim 11, wherein each of the plurality of storage memory cells is coupled to the first conductive line via a respective vertical pillar access device coupled to a respective word line of the array.

13. The apparatus of claim 11, wherein the cumulative capacitance of the plurality of offset memory cells is approximately equal to the capacitance of the first conductive line.

14. A method, comprising:
selectively coupling a subset of memory cells of a first plurality of memory cells couplable to a first conductive line of a memory array by enabling word line drivers associated with the subset of memory cells,
wherein respective voltages held capacitively by the subset of memory cells do not correspond to data values, and
wherein a cumulative capacitance of the subset of memory cells is approximately equal to a capacitance of a second conductive line of the memory array;
sensing, using a sense amplifier coupled to the first and second conductive lines, a respective data value stored by each of a second plurality of memory cells coupled to the second conductive line; and
offsetting a voltage differential of the sense amplifier with a cumulative voltage held capacitively by the subset of memory cells, wherein offsetting the voltage differential comprises:
charging the subset of memory cells to the cumulative voltage;
capacitively holding the cumulative voltage by the subset of memory cells; and
concurrent with sensing the data value, discharging the cumulative voltage from the subset of memory cells.

15. An apparatus, comprising:
an array of memory cells, formed on a CMOS layer, comprising:
a plurality of storage memory cells coupled to a first conductive line, wherein respective voltages held capacitively by the plurality of storage memory cells correspond to data values; and
a plurality of offset memory cells coupled to a plurality of word lines and selectively couplable to a second conductive line via activation of a plurality of vertical pillar access devices,
wherein the plurality of vertical pillar access devices are activated by application of a signal to the plurality of word lines,
wherein respective voltages held capacitively by the plurality of offset memory cells do not correspond to data values,
wherein a cumulative capacitance of the plurality of offset memory cells offsets a capacitance of the first conductive line, and
wherein the plurality of storage memory cells and the plurality of offset memory cells have approximately a same respective capacitance; and
a sense amplifier, formed in the CMOS layer, coupled to the first and second conductive lines.

* * * * *